(12) United States Patent
Shin et al.

(10) Patent No.: US 10,270,513 B2
(45) Date of Patent: Apr. 23, 2019

(54) BROADCAST RECEIVING APPARATUS AND METHOD FOR CONTROLLING THEREOF

(71) Applicant: SAMSUNG ELECTRONICS CO., LTD., Suwon-si, Gyeonggi-do (KR)

(72) Inventors: Hyun-jong Shin, Suwon-si (KR);
Byung-ju Kwak, Suwon-si (KR);
Young-jin Lee, Suwon-si (KR);
Jun-seok Kang, Incheon (KR);
Chang-hyo Kim, Seoul (KR);
Kyoung-seok Noh, Suwon-si (KR);
Dong-jin Park, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/653,732

(22) Filed: Jul. 19, 2017

(65) Prior Publication Data
US 2018/0048376 A1  Feb. 15, 2018

(30) Foreign Application Priority Data

Aug. 11, 2016  (KR) .......................... 10-2016-0102322

(51) Int. Cl.
*H04B 7/08* (2006.01)
*H04H 40/18* (2008.01)
(Continued)

(52) U.S. Cl.
CPC .............. *H04B 7/08* (2013.01); *H04H 40/18* (2013.01); *H04N 5/455* (2013.01); *H04N 5/52* (2013.01);
(Continued)

(58) Field of Classification Search
CPC ......... H03J 5/244; H04N 5/4401; H04N 5/52; H04N 5/455; H04N 21/4382;
(Continued)

(56) References Cited

U.S. PATENT DOCUMENTS 5,451,948 A * 9/1995 Jekel ...................... H03G 3/001
341/139
7,369,827 B1 * 5/2008 Koch ................. H04N 7/17309
348/E7.07

(Continued)

FOREIGN PATENT DOCUMENTS

JP  H10-233969  9/1998
JP  2004-254075  9/2004

(Continued)

OTHER PUBLICATIONS

Search Report and Written Opinion dated Nov. 2, 2017 in counterpart International Patent Application No. PCT/KR2017/007768.

(Continued)

*Primary Examiner* — David S Huang
(74) *Attorney, Agent, or Firm* — Nixon & Vanderhye, P.C.

(57) ABSTRACT

A broadcast receiving apparatus is provided, which includes an input that receives input signals, a signal processing unit which amplifies only a signal in a band that corresponds to a selected channel from among the input signals, and automatic gain controls with a first sensitivity so that the amplified signal maintains a preset level value, and then outputs the result, a demodulator which demodulates the signals output from the signal processing unit into digital transport stream signals, a controller configured to control the signal processing unit so that the signal is automatic gain controlled with a second sensitivity less sensitive than the first sensitivity, when the selected channel is an ultra high frequency (UHF) range signal.

20 Claims, 10 Drawing Sheets

(51) Int. Cl.
    *H04N 5/455*     (2006.01)
    *H04N 5/52*     (2006.01)
    *H04N 21/438*     (2011.01)

(52) U.S. Cl.
    CPC ..... *H04N 21/4382* (2013.01); *H04N 21/4383* (2013.01)

(58) Field of Classification Search
    CPC .............. H04N 21/4383; H04B 1/0057; H04B 1/1036; H04B 7/08; H04H 40/18
    See application file for complete search history.

(56) References Cited

U.S. PATENT DOCUMENTS

| | | |
|---|---|---|
| 7,599,009 B2 | 10/2009 | Ecoff et al. |
| 8,335,204 B2 | 12/2012 | Samarasooriya et al. |
| 8,643,789 B2 | 2/2014 | Williams et al. |
| 9,215,720 B2 | 12/2015 | Clifton et al. |
| 2006/0130101 A1* | 6/2006 | Wessel van Rooyen ................... H04B 1/48 725/100 |
| 2007/0008438 A1 | 1/2007 | Choi |
| 2007/0042732 A1* | 2/2007 | Kang ................... H03J 1/0008 455/179.1 |
| 2010/0130148 A1* | 5/2010 | Sano ................... H04B 1/1036 455/182.2 |
| 2016/0006622 A1 | 1/2016 | Bednarz et al. |

FOREIGN PATENT DOCUMENTS

| | | |
|---|---|---|
| JP | 2009-094958 | 4/2009 |
| JP | 2012-004611 | 1/2012 |
| JP | 2012-138769 | 7/2012 |
| JP | 2014-204178 | 10/2014 |
| KR | 10-2007-0056546 | 6/2007 |
| KR | 10-2008-0020790 | 3/2008 |
| KR | 10-1072535 | 10/2011 |
| KR | 10-1183719 | 9/2012 |
| KR | 10-2014-0057421 | 5/2014 |
| KR | 10-2015-0110665 | 10/2015 |
| KR | 10-1616282 | 4/2016 |
| WO | 2008/023896 | 2/2008 |

OTHER PUBLICATIONS

Extended Search Report dated Jan. 12, 2018 in counterpart European Patent Application No. 17178505.8.

* cited by examiner

BROADCAST RECEIVING APPARATUS AND METHOD FOR CONTROLLING THEREOF

CROSS-REFERENCE TO RELATED APPLICATION

This application is based on and claims priority under 35 U.S.C. § 119 to Korean Patent Application No. 10-2016-0102322, filed on Aug. 11, 2016 in the Korean Intellectual Property Office, the disclosure of which is incorporated by reference herein in its entirety.

BACKGROUND

1. Field

The present disclosure relates generally to a broadcast receiving apparatus and a control method thereof, and for example, to a broadcast receiving apparatus capable of controlling changes in broadcast signals due to communication signals, and a control method thereof.

2. Description of Related Art

The environment of mobile communication technology has changed globally and this gave rise to the recent explosion of use of the Long Term Evolution (LTE) communication.

However, in certain countries, depending on their policies of frequency allocations, circumstances arise where the UHD broadcast frequency band 20 and the mobile communication frequency band 30 such as LTE are used together, as illustrated in FIG. 1. For example, the frequency allocation policy in South Korea allows that the LTE transmission signal frequency band 31 is present between the frequency band 21 corresponding to channels 52 and 53 which are UHD channels and the frequency band 22 corresponding to channels 54 to 56, and that the frequency band 22 corresponding to UHD channels 54 to 56 is present between the LTE transmission signal frequency band 41 and the LTE reception signal frequency band 32.

Accordingly, as illustrated in FIG. 2, there is an increased possibility that relatively stronger frequency such as LTE communication signal frequency 31 can act as adjacent noise with respect to the frequency band 22-1 corresponding to broadcast signal. In the above case, as illustrated in FIG. 3, when a mobile device 200 transmits or receives LTE signals within a predetermined distance from a broadcast receiving apparatus 100 on which UHD TV channel is being watched, problem can occur because the currently-watched TV screen can break or the channel can be skipped. Accordingly, there is a need for a technology that can address such inconvenience of the broadcast viewers described above.

SUMMARY

Example embodiments of the present disclosure address the above disadvantages and other disadvantages not described above.

In order to address the problems described above, example embodiments are directed to providing a broadcast receiving apparatus capable of controlling changes in broadcast signals due to communication signals, and a control method thereof.

In order to address the objectives mentioned above, a broadcast receiving apparatus includes an inputter comprising input circuitry configured to receive input signals, a signal processing unit comprising signal processing circuitry configured to amplify a signal of a selected channel of the input signal, and to perform automatic gain control to control the amplified signal to maintain a predetermined level value and output the amplified signal maintaining the predetermined level value, a demodulator configured to demodulate the signals output from the signal processing unit, a controller configured to control an operation of the signal processing unit and the demodulator in response to the selected channel being a signal in a first frequency band, the controller configured to control the signal processing unit to perform the automatic gain control with a first sensitivity with respect to the amplified signal, and to control the signal processing unit to perform the automatic gain control with a second sensitivity less than the first sensitivity with respect to the amplified signal in response to the selected channel being a signal included in a second frequency band, wherein the second frequency band is an ultra high frequency (UHF) band, and the first frequency band is a frequency band different from the ultra high frequency (UHF) band.

In an example, when the selected channel is a channel in a second frequency band, the controller controls the signal processing unit to perform automatic gain control only when a level value of the amplified signal is outside a preset range.

In response to the selected channel being a channel in the first frequency band, the controller performs automatic gain control with respect to a level value of the amplified signal at a speed corresponding to the first sensitivity, and in response to the selected channel being a channel in the second frequency band, the controller performs automatic gain control with respect to a level value of the amplified signal at a speed corresponding to the second sensitivity, wherein a speed corresponding to the second sensitivity is slower than a speed corresponding to the first sensitivity The signal processing unit may include a first signal processing unit configured to process a signal in a very high frequency-low (VHF-L) signal band, a second signal processing unit configured to process a signal in a very high frequency-high (VHF-L) signal band and a third signal processing unit configured to process a signal in an ultra high frequency (UHF) signal band, the controller controls the first and second signal processing units to perform automatic gain control with the first sensitivity, and controls the third signal processing unit to perform automatic gain control with the second sensitivity.

The signal processing unit may include a first signal processing unit configured to process VHF-L band signal, a second signal processing unit configured to process VHF-H band signal, a third signal processing unit configured to process signal in a band corresponding to UHD channel of UHF signal band, and a fourth signal processing unit configured to process signal in UHF signal band other than band corresponding to UHD channel, the controller controls the first, second and fourth signal processing units to perform automatic gain control with the first sensitivity, and controls the third signal processor to perform automatic gain control with the second sensitivity.

The third signal processing unit may further include a first filter configured to filter a preset frequency band not corresponding to a broadcast signal in the input signals.

Each of the first to fourth signal processing units may include a plurality of amplifiers configured to amplify a level of the input signals, a plurality of automatic gain control units comprising automatic gain control circuitry each connected to the plurality of amplifiers and configured to adjust the level of the amplified signals with a preset value and to output the result, a second filter configured to output only a signal from among the adjusted signals that is in a band corresponding to the selected channel, and a mixer configured to be receive the signals output from the second filter, to down-convert the signals and to output the result.

In the above example, when the level of the input signals is changed, the plurality of automatic gain control units each connected to the plurality of amplifiers of the first, the second and the fourth signal processing units adjust the signals with the first sensitivity so that the changed level of the signals is maintained at the preset level value, and output the result.

When the level of the input signals is changed, the plurality of automatic gain control units each connected to the plurality of amplifiers of the fourth signal processing unit may adjust the signals with the second sensitivity so that the level of the signals is maintained at the preset level value only when the changed level of the signals is outside a preset range of the preset level value, and output the result.

The band corresponding to the UHD channel may be 698 MHz to 806 MHz.

The broadcast receiving apparatus may further include a communication unit comprising communication circuitry configured to transmit the demodulated signals to an external device.

The broadcast receiving apparatus may further include a display configured to display an image corresponding to the demodulated signals.

In an example embodiment, a method of controlling a broadcast receiving apparatus is provided, which may include inputting signals, amplifying a signal of a selected channel from among the input signals, and performing automatic gain control the amplified signal to maintain a predetermined level value and outputting the amplified signal maintaining the predetermined level value, and demodulating the signals output from the signal processing unit. In response to the selected channel being a signal in a first frequency band, performing automatic gain control with the first sensitivity with respect to the amplified signal, and in response to the selected channel being a signal included in a second frequency band, performing automatic gain control with the second sensitivity less sensitive than the first sensitivity with respect to the amplified signal. The second frequency band is an ultra high frequency signal band, and the first frequency band is a frequency band different from a ultra high frequency signal band.

In an example, the outputting comprises, when the selected channel is a channel in a second frequency band, performing automatic gain control only when a level value of the amplified signal is outside a preset range.

The outputting comprises, in response to the selected channel being a channel in the first frequency band, performing automatic gain control with respect to a level value of the amplified signal at a speed corresponding to the first sensitivity, and in response to the selected channel being a channel in the second frequency band, performing automatic gain control with respect to a level value with respect to the amplified signal at a speed corresponding to the second sensitivity. A speed corresponding to the second sensitivity is slower than a speed corresponding to the first sensitivity.

The control method may further include filtering a preset frequency band not corresponding to a broadcast signal in the input signals, the band corresponding to the selected channel is any one of bands corresponding to very high frequency-low (VHF-L) signal band, very high frequency-high (VHF-H) signal band, band corresponding to UHD channel of ultra high frequency (UHF) signal band, and UHF signal bands other than the band corresponding to the UHD channel.

The outputting may include amplifying a level of the input signals, adjusting the level of the amplified signals to a preset value, outputting only a signal from among the adjusted signals that is in a band corresponding to the selected channel, and down-converting the output signal that is in the band corresponding to the selected channel and outputting the result.

When the band corresponding to the selected channel is the VHF-L band, the VHF-H band and the UHF signal band other than the band corresponding to the UHD channel, and when the level of the input signals is changed, the adjusting may include adjusting the signals with a first sensitivity so that the changed level of the signals is maintained at the preset level value.

When the band corresponding to the selected channel is the band corresponding to the UHD channel, and when the level of the input signals is changed, the adjusting may include adjusting the signals with the second sensitivity so that the level of the signals is maintained at the preset level value only when the changed level of the signals is outside a preset range of the preset level value.

The control method may further include transmitting the demodulated signals to an external device.

BRIEF DESCRIPTION OF THE DRAWINGS

The above and/or other aspects, features and attendant advantages of the present disclosure will be more apparent and readily appreciated from the following detailed description, taken in conjunction with the accompanying drawings, in which like reference numerals refer to like elements, and wherein.

DETAILED DESCRIPTION

Various modifications may be made to the various example embodiments of the present disclosure, and certain example embodiments will be described below in greater detail with reference to attached drawings. However, in the present disclosure, the expression "comprise" or "consist of" is not intended to limit the scope of the characteristic, number, or certain embodiment, but should be instead understood as encompassing all the modifications, equivalents to replacements that are included in the concept and technical concept as disclosed herein. Further, in explaining the present disclosure, any specific explanation on a well-known related configuration or function deemed to obscure the gist of the present disclosure will be omitted.

The expression, "first," "second," and so on may be used in describing a variety of elements, but these elements should not be limited to the expression. The expressions are used only for the purpose of distinguishing one element from another.

The expressions used herein are only for describing certain example embodiments, and not intended to limit the scope of the disclosure. Unless otherwise specified, a singular expression includes a plural expression. The expression is used to designate an existence of steps, operations, elements, components or a combination of these, but should not be understood as precluding an existence or a possibility of adding one or more of other characteristics, numbers, steps, operations, elements, components or a combination of these.

In explaining example embodiments, a "module" or "unit" may be provided to perform at least one function or operation and can be implemented as hardware or software, or as a combination of hardware and software. Further, a plurality of "modules" or "units" may be integrated into at least one module to be implemented by at least one processor (not illustrated), except for when it is necessary that the "modules" or "units" are implemented as specific hardware.

The broadcast receiving apparatus 100 as used herein may refer, for example, to a display apparatus provided with a display that can process externally-received signals and display the same on itself. However, the broadcast receiving apparatus 100 is not limited to the specific example provided above. Accordingly, the broadcast receiving apparatus 100 may be implemented as a form of a tuner to extract signals corresponding to a tuned channel from the received signals, or a set-top box that is provided with a tuner and transmits the signals of the tuned channel to a separate display apparatus.

Figure 1:
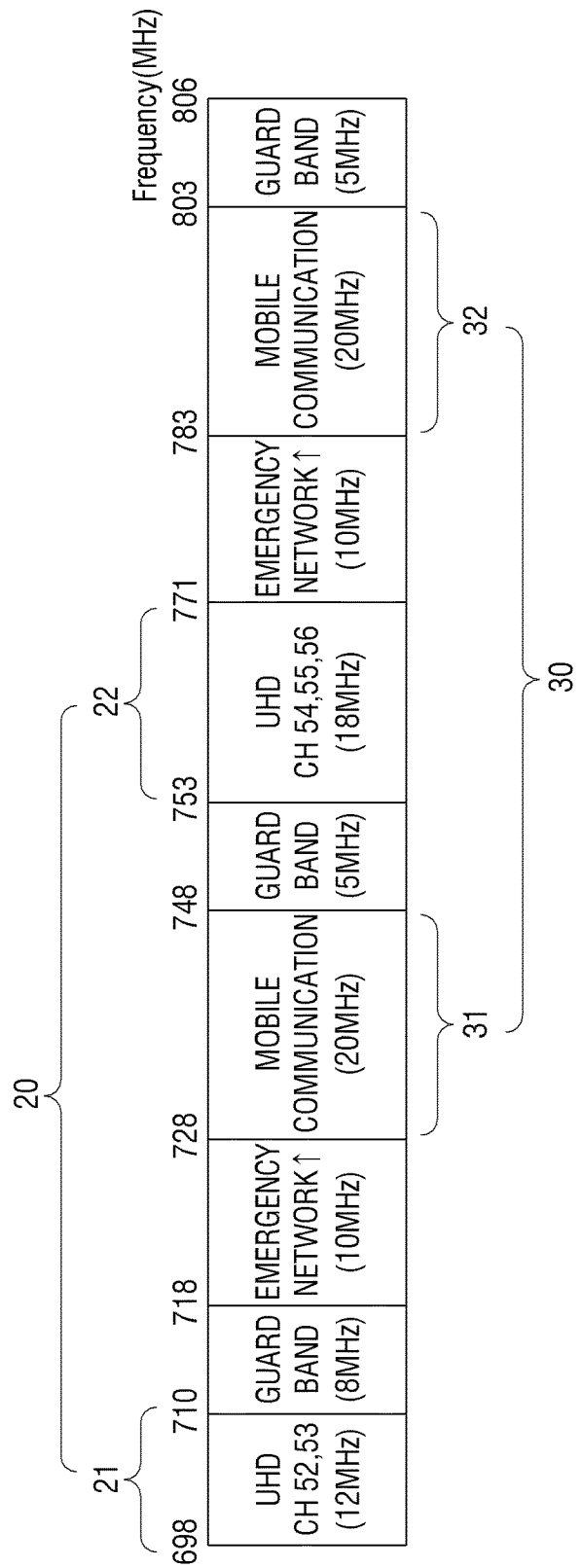
FIG. 1 is a diagram illustrating a relationship between a broadcast receiving apparatus and a mobile device according to an example embodiment.
Figure 2:
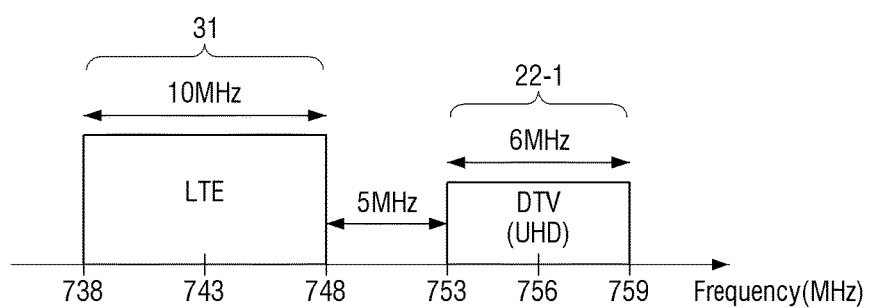
FIGS. 2 and 3 are diagrams illustrating an example of frequencies of broadcast signal and LTE communication signal.
Figure 3:
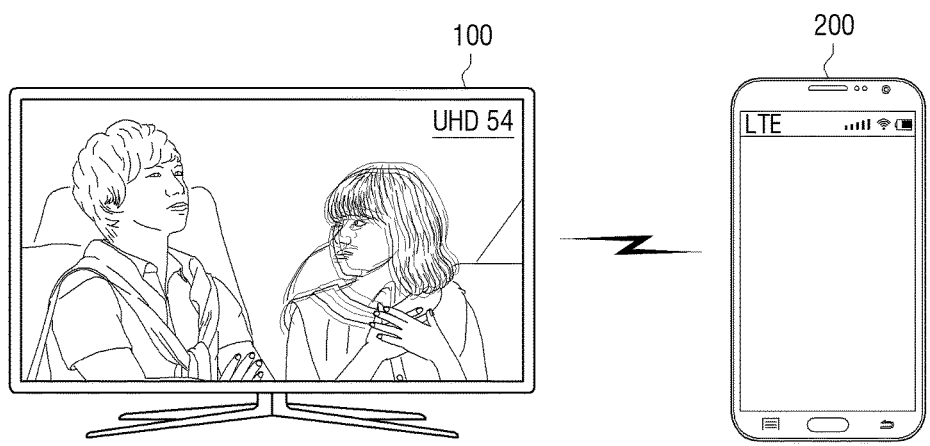
Figure 4:
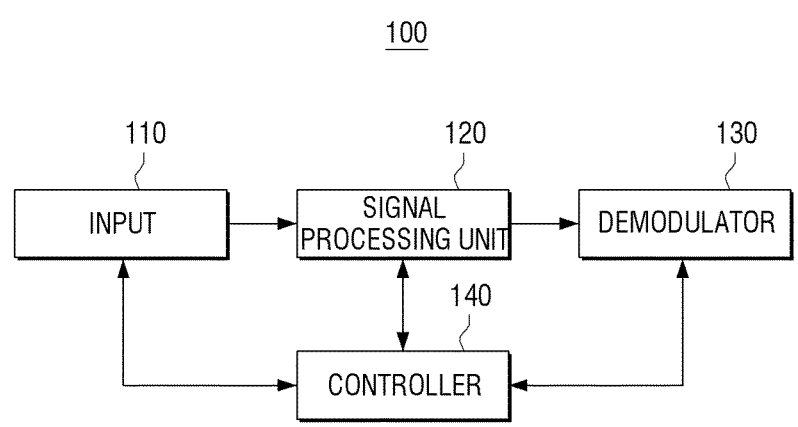
FIG. 4 is a block diagram illustrating an example configuration of a broadcast receiving apparatus according to an example embodiment.

FIG. 4 is a block diagram illustrating an example configuration of a broadcast receiving apparatus according to an example embodiment.

Referring to FIG. 4, a broadcast receiving apparatus 100 according to an example embodiment may include an input (e.g., including input circuitry) 110, a signal processing unit (e.g., including signal processing circuitry) 120, a demodulator 130, and a controller (e.g., including processing circuitry) 140.

The input 110 may include various input circuitry and receive signals from a broadcasting station or a satellite in a wired or wireless manner. For example, the input 110 may receive broadcast signals via antenna or cable.

The signal processing unit 120 may include various signal processing circuitry and amplify only the signals in the band that corresponds to selected channel among the signals received from the input 110, and automatic gain control with a first sensitivity so that the amplified signal maintains a preset level value, and then output the result. For example, the signal processing unit 120 may remove noise of the frequency band corresponding to the tuned channel, adjust to a preset level value, and deliver the result to the demodulator 130.

Meanwhile, the signal processing unit 120 may be configured with a plurality of signal processing units, and for the purpose of effective signal processing, the signal processing units for processing signals may vary according to the frequency bands corresponding to a plurality of channels. For example, by defining about 30 MHz to about 300 MHz bands to be the very high frequency (VHF) signal bands, and defining about 300 MHz to 3000 MHz bands to be the ultra high frequency (UHF) signal bands, the VHF signal bands may then be divided into VHF-low (VHF-L) signal band that includes about 54 MHz to about 88 MHz bands, and VHF-high (VHF-H) signal band that includes about 174 MHz to about 216 MHz bands. Further, the UHF signal region may be divided into a signal band that corresponds to the ultra-HD (UHD) channel, and other bands.

Accordingly, a plurality of signal processing units may each be provided with configurations to process the signals received from the input 110. The detailed configuration of the signal processing unit 120 will be described in greater detail below with reference to FIG. 6.

The demodulator 130 may demodulate the signals processed and output from the signal processing unit 120. Specifically, The demodulator 130 may demodulate the signals processed and output from the signal processing unit 120 into digital transport stream signals.

The controller 140 may include various processing circuitry and controls the overall operation of broadcast receiving apparatus 100. Specifically, the controller 140 may control the signal processing unit 120 so that the signal received from the input 110 is processed and then delivered to the demodulator 130. In this case, the controller 140 may determine a frequency corresponding to a channel selected by a user, and perform other signal processing based on the determined frequency. Specifically, the controller 140 may control to perform signal processing in a signal processing unit corresponding to a determined frequency among a plurality of signal processing units.

Meanwhile, when the selected channel is in the band other than the UHF range signal, the controller 140 may control the signal processing unit 120 to perform automatic gain control with the first sensitivity. In an example, the first sensitivity may refer to a sensitive reaction that may be performed when the level of input to the broadcast receiving apparatus 100 is changed, in order to maintain the level of the changed signal to a preset level value. Specifically, when a level of an input signal exceeds a level range corresponding to a first sensitivity based on a predetermined level value, the controller 140 may perform automatic gain control to maintain the predetermined level value and output the same.

Meanwhile, when the selected channel is the signal in the UHF range, the controller 140 may control the signal processing unit 120 to perform automatic gain control with a second sensitivity that is less sensitive than the first sensitivity. In an example, the second sensitivity may be applied when the level of input to the broadcast receiving apparatus 100 is changed, in which case the signal processing unit 120 may be controlled to perform automatic gain control with respect to the signal level only when the changed level of the signal is outside a predetermined range corresponding to a second sensitivity based on a predetermined level value. In this case, a level range corresponding to the first sensitivity may be less than that corresponding to the second sensitivity. For example, when the selected channel is UHF range signal, the controller 140 may control the signal processing unit 120 to not perform automatic gain control when the level of the amplified input signal is within a preset range of level value, so as to adjust the level of the signal with a lower sensitivity. In an example, the selected channel may be UHD channel, and the band corresponding to the UHD channel may be 698 MHz to 806 MHz. In an example, the level of input to the broadcast receiving apparatus 100 may be varied because of the influence of the LTE signal of an external mobile device.

However, even though it has been described by way of non-limiting example that the controller 140 performs automatic gain control with the first sensitivity or the second sensitivity, at the time of actual implementation, it may be implemented in the form of adaptively adjusting sensitivity according to the situation. For example, the controller 140 may differently set a level range corresponding to a sensitivity corresponding to the situation and perform automatic gain control.

Meanwhile, the controller 140 may compare a peak point of the level of the amplified signal with a peak point of a preset level value and when a difference between the peak points exceeds a preset value, may lower the peak point of the preset level value so that the controller 140 may reduce fluctuation of the signals provided to the demodulator 130 by way of decreasing the adjustment of signal level. Further, the controller 140 may reduce fluctuation of the signals provided to the demodulator 130 by decreasing the speed of adjusting the signal level.

As described above, when the selected channel is UHF range signal, by adjusting the signal level of the signal that varies more frequently due to LTE signal with a lower sensitivity or by decreasing signal level adjustment or speed, it is possible to reduce the fluctuation of the signals provided to the demodulator 130 and thus provide optimum stability and viewing condition for the selected channel.

Although it is described that each feature is a separate feature, at the time of actual implementation, each feature may be implemented as a single chip.

Figure 5:
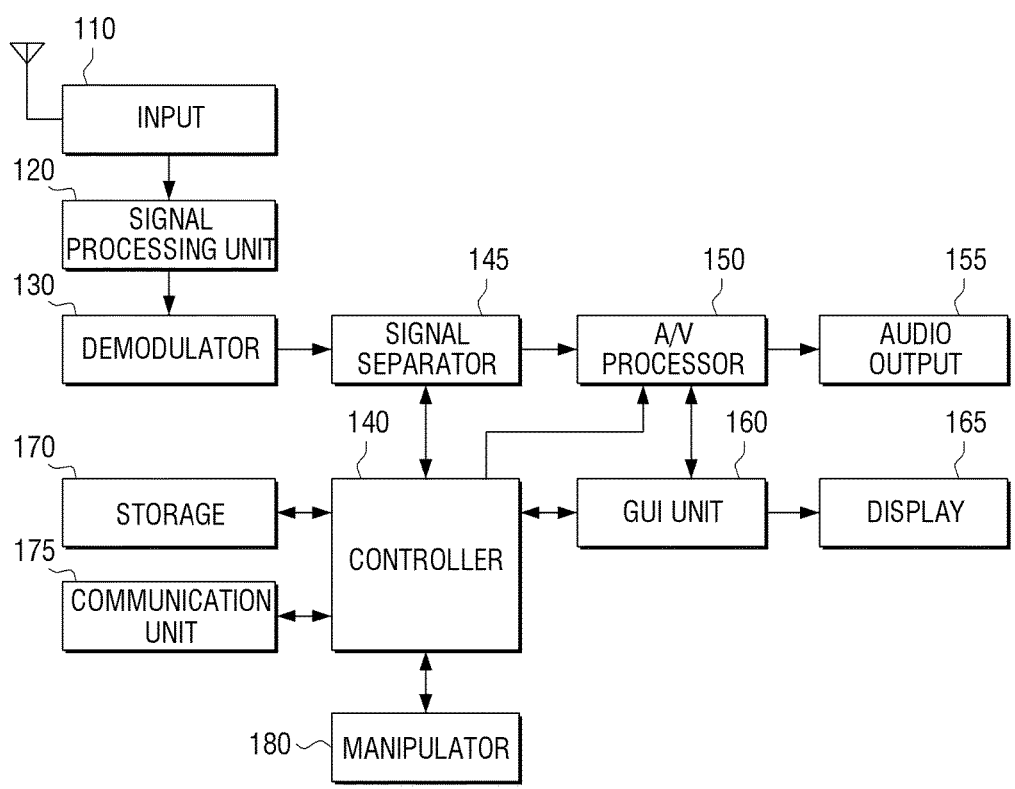
FIG. 5 is a block diagram illustrating an example configuration of a broadcast receiving apparatus according to an example embodiment.

While simplified configuration of the broadcast receiving apparatus 100 has been described above, it is to be noted that the broadcast receiving apparatus 100 may include the configuration as illustrated in FIG. 5. Accordingly, a more detailed configuration of the broadcast receiving apparatus 100 will be described below with reference to FIG. 5.

FIG. 5 is a block diagram illustrating an example configuration of a broadcast receiving apparatus according to an example embodiment.

Referring to FIG. 5, a broadcast receiving apparatus according to example embodiments may be configured with an input (e.g., including input circuitry) 110, a signal processing unit (e.g., including signal processing circuitry) 120, a demodulator 130, a controller (e.g., including processing circuitry) 140, a signal separator (e.g., including signal separating circuitry) 145, an A/V processor (e.g., including A/V processing circuitry) 150, an audio output (e.g., including audio output circuitry) 155, a GUI unit (e.g., including GUI circuitry) 160, a display 165, a storage 170, a communication unit (e.g., including communication circuitry) 175, and a manipulator (e.g., including input circuitry) 180.

The operations of the input 110, signal processing unit 130 and the demodulator 130 will not be repeated below, but will be referenced to above with reference to FIG. 4.

The signal separator 145 may include various circuitry that separates broadcast signal (e.g., transport stream signal) into image signal, audio signal, and additional information signal. Specifically, the signal separator 145 may separate the transport stream signal delivered through the demodulator 130 into image signal, audio signal and additional information signal. The signal separator 145 then transmits the image signal and audio signal to the A/V processing unit 150.

The A/V processing unit 150 may include various A/V processing circuitry and performs signal processing (e.g., video decoding, video scaling, audio decoding, and so on) for the image signal and audio signal received from the signal separation unit 145 and the storage 170. The A/V processing unit 150 outputs the image signal to the GUI unit 160, and outputs the audio signal to the audio output 155.

When the received image and audio signals are stored at the storage 170, the A/V processing unit 150 may output a compressed form of image and audio signals to the storage 170.

The audio output 155 may include various audio output circuitry that converts the audio signal received from the A/V processing unit 150 into a sound, and outputs the same to a speaker (not illustrated) or to an external device connected via an external output terminal (not illustrated).

The GUI unit 160 may include various circuitry that generates graphic user interface (GUI) to be provided to a user. The GUI unit 160 then adds the generated GUI to an image outputted from the A/V processing unit 150.

The display 165 may display an image corresponding to the transport stream signal demodulated by the demodulator 130. For example, the display 165 may display a GUI-added image.

The storage 170 may store image content. Specifically, the storage 170 may be provided with the image content composed of compressed image and audio from the A/V processing unit 150 and store the same, and may output the stored image content to the A/V processing unit 150 under control of the control unit 190. Meanwhile, the storage 170 may be implemented in various forms, such as, for example, and without limitation, a hard disk, a non-volatile memory, a volatile memory, or the like.

The communication unit 175 may include various communication circuitry and transmit the demodulated transport stream signal to an external device. Specifically, the communication unit 175 may transmit processed signal when the broadcast receiving apparatus is not provided with the display 165 such that an external display device has to display the image of the tuned channel. Meanwhile, in an example in which the broadcast receiving apparatus is provided with the display 165 and is thus capable of displaying the processed signal itself, the input 110 may play a role of the communication unit 175.

The manipulation unit 180 may include various circuitry for receiving an input and may be implemented for example, and without limitation, as a touchscreen, a touchpad, a key button, a keypad, or the like, to provide a user's manipulation on the broadcast receiving apparatus. Specifically, the user may control the operation of the broadcast receiving apparatus 100 by selecting a channel to watch, and so on, using the manipulation unit 180.

The controller 140 may include various processing circuitry and controls the overall operation of the broadcast receiving apparatus 100. Specifically, the controller 140 may control the A/V processing unit 150, the GUI unit 160 and the display 165 so that an image is displayed in response to a control command input through the manipulation unit 180.

While it is described by way of non-limiting example with reference to FIG. 5 that the functions described above are implemented in only the broadcast receiving apparatus that receives and displays broadcast, it is to be understood that the signal processing apparatus and signal processing method described below are equally applicable to any broadcast receiving apparatus that can display images. Further, while it is illustrated and described above that the broadcast receiving apparatus has a TV form that includes signal processing configuration, it is to be understood that in a non-limiting example, the broadcast receiving apparatus may be a tuner or a set-top box that does not display the signal-processed image, but sends the signal-processed image to a separate display device.

Meanwhile, while only one signal processing unit 120 is exemplified above, it is to be noted that a plurality of signal processing units 120 may be configured according to frequency of the channel. This will be described in greater detail below with reference to FIGS. 7 to 9.

As described above, according to example embodiments, when the selected channel is UHF range signal, the broadcast receiving apparatus may adjust the signal level of the signal that varies more frequently due to LTE signal with a lower sensitivity, or may decrease the signal level adjustment or speed, thereby reducing the fluctuation of the signals provided to the demodulator 130 and providing optimum stability and viewing condition for the selected channel.

Figure 6:
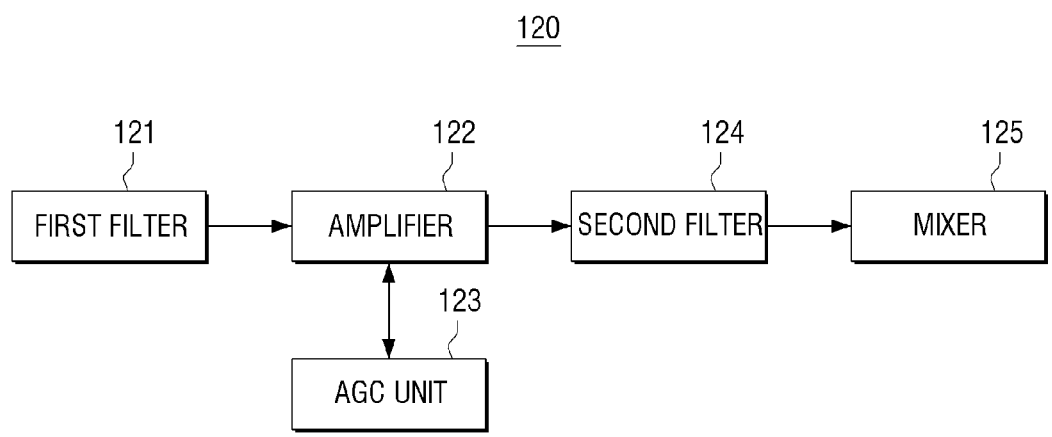
FIG. 6 is a block diagram illustrating an example configuration of a signal processing unit included in the broadcast receiving apparatus illustrated in FIG. 4.

FIG. 6 is a block diagram illustrating an example configuration of a signal processing unit included in the broadcast receiving apparatus illustrated in FIG. 4.

Referring to FIG. 6, the signal processing unit 120 of the broadcast receiving apparatus 120 according to an example embodiment may include various signal processing circuitry including, for example, and without limitation, a first filter 121, an amplifier 122, an automatic gain controller (AGC unit including various automatic gain control circuitry) 123, a second filter 124, and a mixer 125.

The first filter 121 may filter a preset frequency band that does not correspond to broadcast signal, among the signals inputted by the input unit. Specifically, the first filter 121 may remove the LTE signal region that does not correspond to the broadcast signal. In an example, the first filter 121 may be at least one of high pass filter, low pass filter, and band stop filter. For example, when the user-selected channel is UHD channel 54, the first filter 121 may be the high pass filter or band stop filter to remove the LTE signal in a band under 753 MHz corresponding to the selected channel.

Meanwhile, while it is described above that the signal processing unit 120 includes the first filter 121, in actual implementation, the signal processing unit 120 may be configured in a form that does not include the first filter 121, in which case the signal received from the input may be provided directly to the amplifier 122.

The amplifier 122 may amplify the level of the input signals. Specifically, the amplifier 122 may amplify a weak signal received at the input, and when the first filter 121 is provided, may amplify the level of the LTE signal-removed signal. In this example, the amplifier 122 may be low noise amplifier (LNA) and may reduce the overall noise figure of the signal. Specifically, the parameter amplifier, the low noise transistor amplifier, the major amplifier, and so on may be used, and room-temperature parametric amplifier, gallium arsenide (GaAs), field effect transistor (FET), or the like, without limitation, which have been made available by the development in the semiconductor technology may also be used.

The automatic gain control (AGC) unit 123 may adjust the level of the amplified signal with a preset value. Specifically, the AGC unit 123 is configured to control the gain of the amplifier, e.g., control the strength of the signal so as to maintain the strength of the automatically-outputted signal constantly to a preset level value. The preset level value may be determined according to information of the demodulator included in the broadcast receiving apparatus.

Meanwhile, although not illustrated, the controller may control the AGC unit 123 to control the strength of the signal with different sensitivities depending on frequency domains. This will be described in greater detail below with reference to FIGS. 7 to 9.

The second filter 124 may output only the signals of the band corresponding to a selected channel, among the signals level-adjusted by the AGC unit 123. Specifically, the second filter 124 may pass only the signals of the band corresponding to the selected channel and then output the signals to the mixer 125 for further processing. In this example, the second filter 124 may be at least one of the high pass filter, low pass filter, and band pass filter.

The mixer 125 may receive the signals output from the second filter 124 and down-convert the signals. Specifically, in order to facilitate transmission, the mixer 125 may down-convert the signals so that the signals formed as high frequency signals can be processed at the demodulator. For example, the mixer 125 may down-convert the signals having intermediate frequency of approximately 666 MHz to about 5 MHz. In this example, the down-converted center frequency may be determined by the information of the demodulator.

Meanwhile, while it has been illustrated and described above by way of non-limiting example for convenience of explanation that the signals output from the second filter 124 are directly input to the mixer 125, in actual implementation, there may be one or more amplifiers and one or more AGC units provided to adjust the signal level more accurately.

Meanwhile, although not illustrated, the broadcast receiving apparatus may additionally include an amplifier 122 included in the signal processing unit 120, a plurality of amplifiers other than the second filter 124, an AGC unit connected to the amplifier, and a plurality of filters serving as the second filter so as to extract the frequency band corresponding to the selected channel more accurately and implement the strength of the signal as desired by the demodulator 130.

Figure 7:
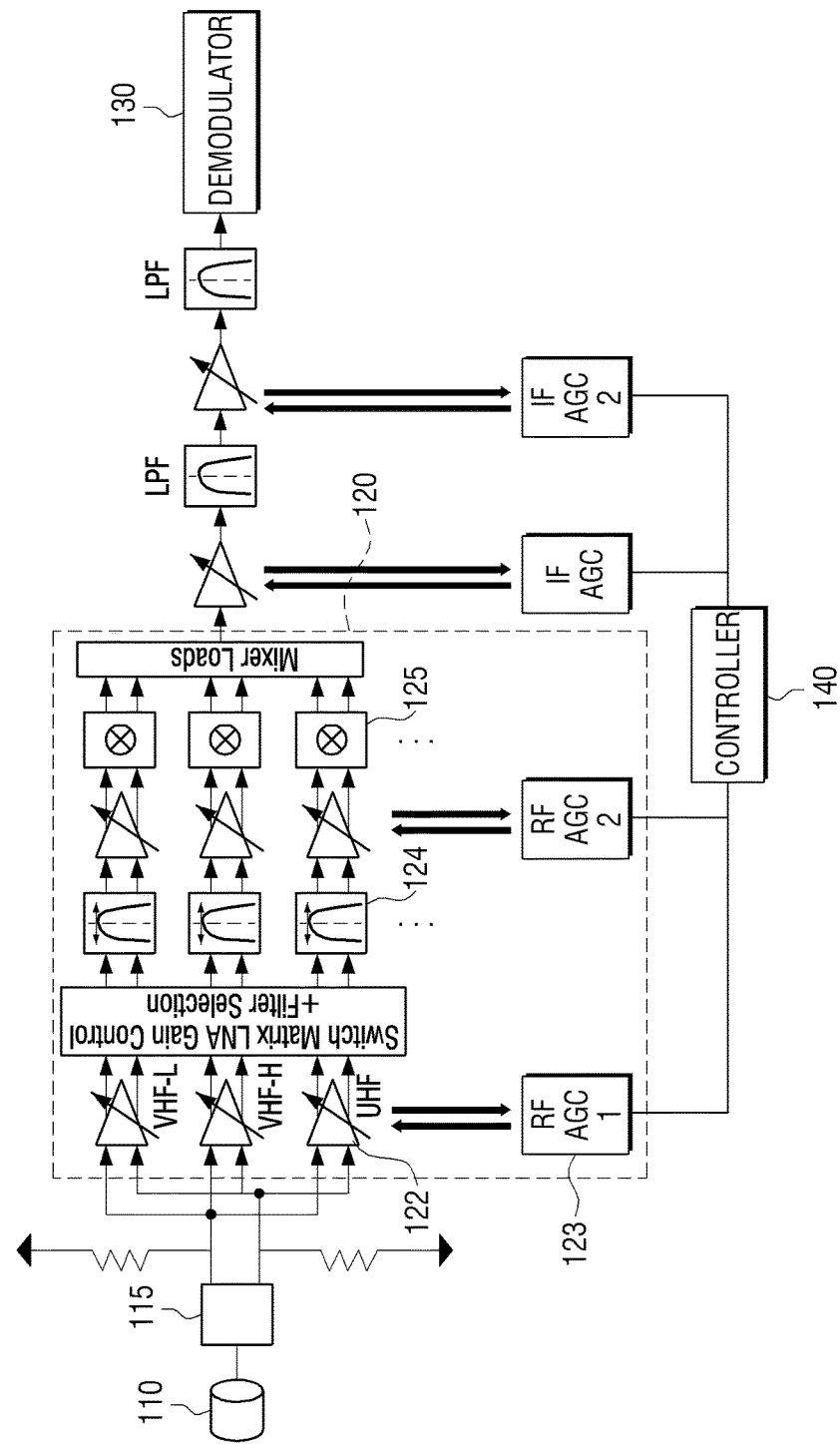
FIGS. 7, 8 and 9 are diagrams illustrating example configurations of a broadcast receiving apparatus according to various example embodiments.
Figure 8:
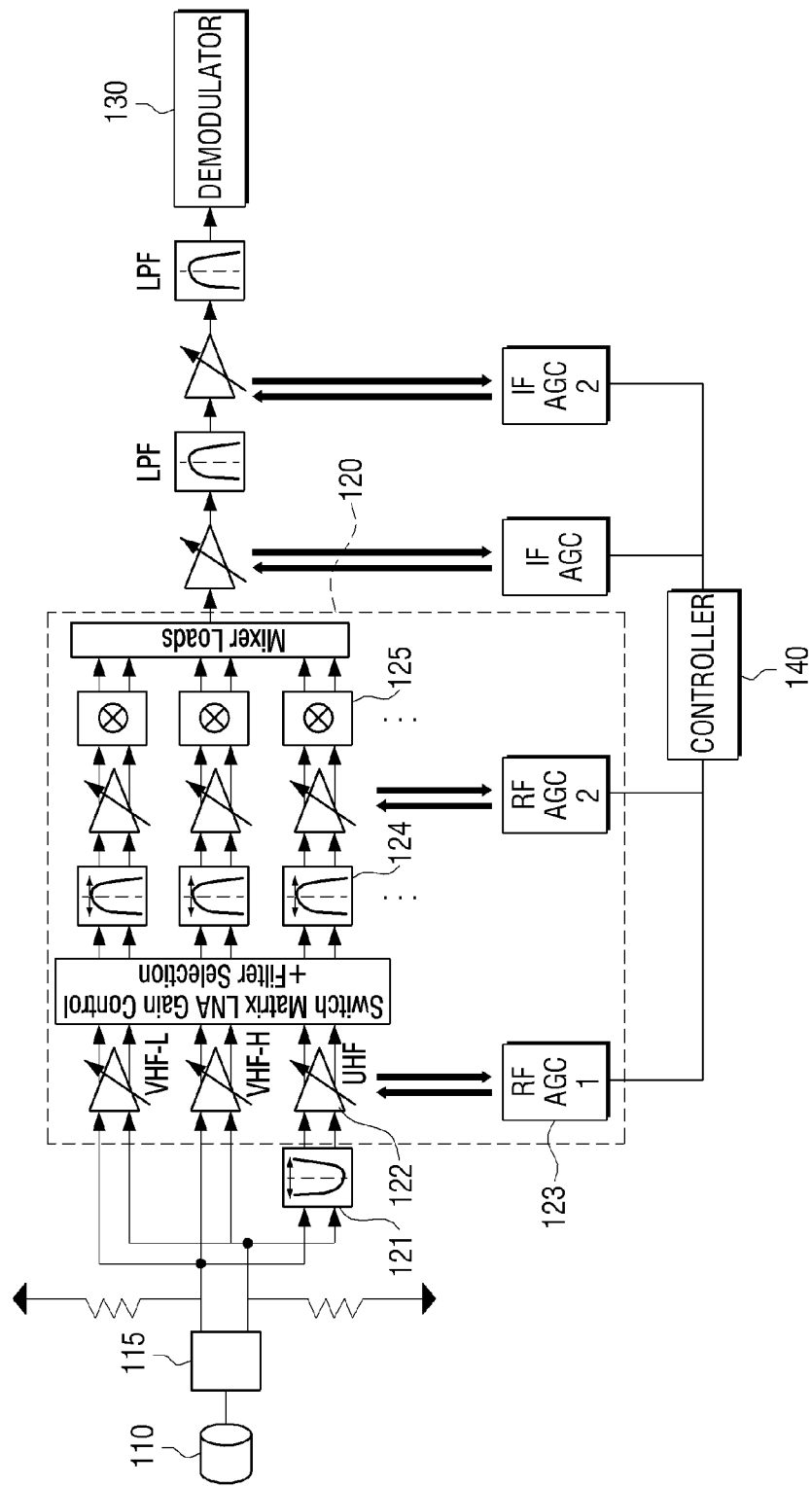
Figure 9:
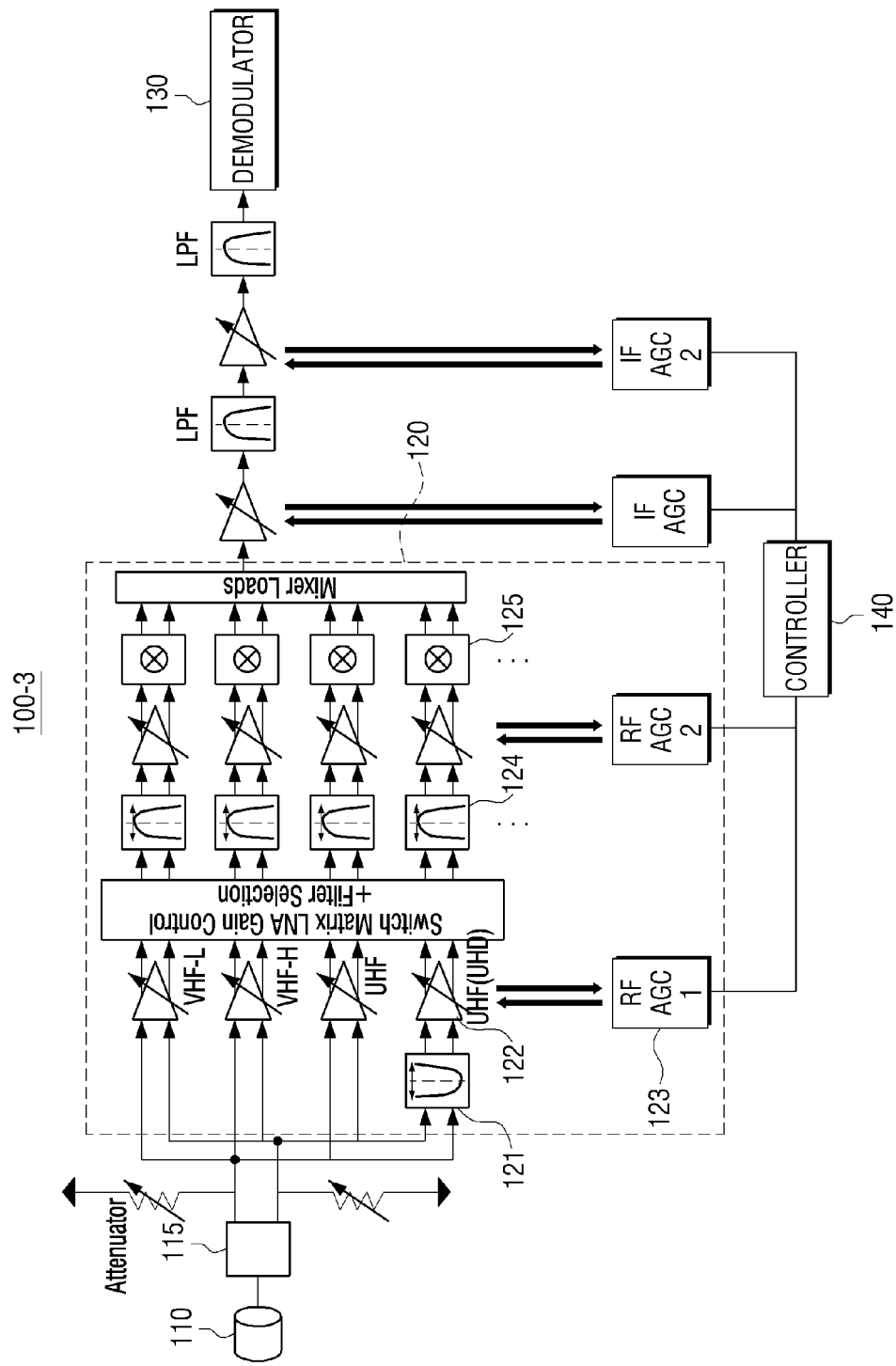

FIGS. 7, 8 and 9 are diagrams illustrating example configurations of a broadcast receiving apparatus according to various example embodiments.

FIG. 7 illustrates an example broadcast receiving apparatus 100-1 that includes a controller (e.g., including processing circuitry) 140 to control the AGC unit 123, according to an example embodiment.

Referring to FIG. 7, the broadcast receiving apparatus 100-1 may include an input 110, a balun 115, a signal processing unit (e.g., including signal processing circuitry) 120, a demodulator 130, and a controller (e.g., including processing circuitry) 140.

The broadcast receiving apparatus 100-1 may receive the signals from the input 110, convert the signals to differential signals via the balun 115 and then deliver the signals to the amplifier 122 of the signal processing unit 120. In this example, the balun 115 may be a coupling device that is used to remove interferences of the image signal and the audio signal and to ensure that both do not influence each other.

Meanwhile, the signal processing unit 120 may include various signal processing circuitry, including a plurality of signal processing units configured to distinguish and process the signals according to frequency domains corresponding to a plurality of channels. Specifically, the signal processing unit 120 may include a signal processing unit to process the VHF-L band signals, a signal processing unit to process the VHF-H band signals, and a signal processing unit to process the UHF range signal band.

For convenience of explanation, example embodiments will be described below with reference to a signal processing unit to process the UHF range signal band susceptible to influence of LTE signals.

The signal processing unit to process the UHF range signal band may include various signal processing circuitry, such as, for example, and without limitation, an amplifier 122, a second filter 124 and a mixer 125, in which the amplifier 122 may be connected to an AGC unit 123. In the above example, in order to implement the level of signal desired by the demodulator more accurately, more amplifiers may be provided, and an AGC unit connected to the amplifier may be further provided. Meanwhile, configurations of the signal processing unit to process the VHF-L band signals and the signal processing unit to process the VHF-H band signals will not be redundantly described in detail below, as the configurations are identical to that of the signal processing unit to process the UHF range signal band.

Meanwhile, although FIG. 7 illustrates that the AGC unit 123 is connected only to the signal processing unit to process the UHF range signal band, in actual implementation, the AGC unit 123 may also be connected to an amplifier to amplify the VHF-L band signals and to an amplifier to amplify the VHF-H band signals, and each of the amplifiers may be connected to AGC unit, respectively.

Meanwhile, in order to extract the frequency band corresponding to a selected channel more accurately and deliver the same to the demodulator 130, the broadcast receiving apparatus 100-1 may further include a plurality of amplifiers in addition to the signal processing unit 120, a plurality of filters serving as the second filter, and AGC units connected to a plurality of amplifiers.

In the above example, a plurality of AGC units included in the signal processing unit 120 may adjust the level of radio frequency (RF), and a plurality of AGC units provided in addition to the signal processing unit 120 may adjust the level of intermediate frequency (IF) down-converted by the mixer 125 of the signal processing unit 120 and outputted.

Meanwhile, the controller 140 may be connected to a plurality of RF AGC units included in the signal processing unit 120 and to a plurality of IF AGC units provided in addition to the signal processing unit 120, to control the AGC units according to the frequency band of the signals of a selected channel.

The configurations of the respective components of the broadcast receiving apparatus 100-1 will not be repeated in detail below, but referenced to the description provided above with reference to FIGS. 4 and 6.

As described above, when the selected channel is UHF range signal, by adjusting the level of the signal that varies more frequently due to LTE signal with a lower sensitivity, it is possible to reduce the fluctuation of the signals provided to the demodulator 130 and thus provide optimum and/or improved stability and viewing condition for the selected channel.

Meanwhile, FIG. 8 is a diagram illustrating an example broadcast receiving apparatus 100-2 that includes a controller (e.g., including processing circuitry) 140 to control the first filter 121 and the AGC unit 123, according to an example embodiment.

Referring to FIG. 8, the broadcast receiving apparatus 100-2 may include an input 110, a balun 115, a signal processing unit (e.g., including signal processing circuitry) 120, a demodulator 130, and a controller (e.g., including processing circuitry) 140.

In the above example, the signal processing unit 120 may include a plurality of signal processing units configured to distinguish and process the signals according to frequency domains corresponding to a plurality of channels. Specifically, the signal processing unit 120 may include a signal processing unit to process the VHF-L band signals, a signal processing unit to process the VHF-H band signals, and a signal processing unit to process the UHF range signal band.

For convenience of explanation, example embodiments will be described below with reference to a signal processing unit to process the UHF range signal band susceptible to influence of LTE signals.

The signal processing unit to process the UHF range signal band may include various signal processing circuitry, such as, for example, and without limitation, a first filter 121, an amplifier 122, a second filter 124 and a mixer 125, in which the amplifier 122 may be connected to an AGC unit 123. In the above example, in order to implement the level of signal desired by the demodulator more accurately, more amplifiers may be provided, and an AGC unit connected to the amplifier may be further provided.

Specifically, the first filter 121 may filter a preset frequency band that does not correspond to broadcast signal, among the signals inputted by the input unit 110.

Specifically, the first filter 121 may remove the frequency band corresponding to the LTE signal that influences the UHF range signals.

Meanwhile, since the VHF-L band signals and VHF-H band signals are not influenced by the LTE signals or influenced significantly less than the UHF range signals, the signal processing unit to process the VHF-L band signals and the signal processing unit to process the VHF-H band signals may not include filters to play a role of the first filter 121.

Meanwhile, the configurations of the signal processing unit to process the VHF-L band signals and the signal processing unit to process the VHF-H band signals will not be repeated in detail below, as the configurations are identical to that of the signal processing unit to process the UHF range signal band.

Meanwhile, the components of the broadcast receiving apparatus 100-2 other than the signal processing unit 120 illustrated in FIG. 8 perform the same operation as the configuration of the broadcast receiving apparatus 100-1 illustrated in FIG. 7, which will not be repeated here.

As described above, when the selected channel is UHF range signal, by removing the frequency domain that corresponds to LTE signals first to thus reduce the influence from the LTE signals, and by adjusting the level of the signal with a lower sensitivity, it is possible to reduce the fluctuation of the signals provided to the demodulator 130 and thus provide optimum stability and viewing condition for the selected channel.

Meanwhile, FIG. 9 is a diagram illustrating an example broadcast receiving apparatus 100-3 that includes a controller 140 to control a signal processing unit to process the signals in a band corresponding to the UHD channel of UHF signal band, the first filter 121 and the AGC unit 123, according to an example embodiment.

Referring to FIG. 9, the broadcast receiving apparatus 100-3 may include an input 110, a balun 115, a signal processing unit (e.g., including signal processing circuitry) 120, a demodulator 130, and a controller (e.g., including processing circuitry) 140.

In the above example, the signal processing unit 120 may include a plurality of signal processing units configured to distinguish and process the signals according to frequency domains corresponding to a plurality of channels. Specifically, the signal processing unit 120 may include a first signal processing unit to process the VHF-L band signals, a second signal processing unit to process the VHF-H band signals, a third signal processing unit to process the signals in a band corresponding to UHD channel among the UHF signal band, and a fourth signal processing unit to process the signals in the UHF signal band other than bands corresponding to the UHD channel.

In other words, it is possible to add a signal processing unit to process only the frequency band in the UHF signal band that includes the signals corresponding to the UHD channel susceptible to the influence of the LTE signals, such that the LTE signal filtering is not performed for the frequency band that is not susceptible to influence of the LTE signals and possible influence on the broadcast signal due to filtering can be prevented.

Accordingly, since the VHF-L band signals, VHF-H band signals and UHF signal band signals other than the bands corresponding to the UHD channel are not influenced by the LTE signals or influenced significantly less than the UHF range signals, the first signal processing unit to process the VHF-L band signals, the second signal processing unit to process the VHF-H band signals, and the fourth signal processing unit to process the signals of the UHF signal band other than the bands corresponding to the UHD channel may not include filters to play a role of the first filter 121.

For convenience of explanation, example embodiments will be described below with reference to the third signal processing unit that is susceptible to influence of LTE signals.

The third signal processing unit to process the band corresponding to the UHF range signal band among the UHF signal bands may include a first filter 121, an amplifier 122, a second filter 124 and a mixer 125, in which the amplifier 122 may be connected to an AGC unit 123. In the above example, in order to implement the level of signal desired by the demodulator more accurately, more amplifiers may be provided, and an AGC unit connected to the amplifier may be further provided.

Specifically, the first filter 121 may filter a preset frequency band that does not correspond to broadcast signal, among the signals inputted by the input unit 110. Specifically, the first filter 121 may remove the frequency band corresponding to the LTE signal that influences the band corresponding to the UHF channel among the UHF signal bands.

Meanwhile, the configurations of the first signal processing unit to process the VHF-L band signals, the second signal processing unit to process the VHF-H band signals, and the fourth signal processing unit to process the signals of the UHF signal band other than the band corresponding to the UHF channel are identical to the configuration of the third signal processing unit and will not be redundantly described below.

Meanwhile, components of the broadcast receiving apparatus 100-3 other than the signal processing unit 120 illustrated in FIG. 9 that perform the same operation as the components of the broadcast receiving apparatus 100-1 illustrated in FIG. 7, will not be repeated here.

As described above, it is possible to add a separate signal processing unit to process only the signals of the frequency band in the UHF range that corresponds to the UHD channel that is susceptible to the influence of the LTE signals, such that the LTE signal filtering is not performed for the frequency band that is almost not susceptible to influence of the LTE signals. Accordingly, possible influence on the broadcast signal due to filtering can be prevented.

Further, for the signals in a band that corresponds to a UHF channel susceptible to the influence of the LTE signals, by reducing the influence from the LTE signals and by adjusting the level of the signal with a lower sensitivity, it is possible to reduce the fluctuation of the signals provided to the demodulator 130 and thus provide optimum stability and viewing condition for the selected channel.

Figure 10:
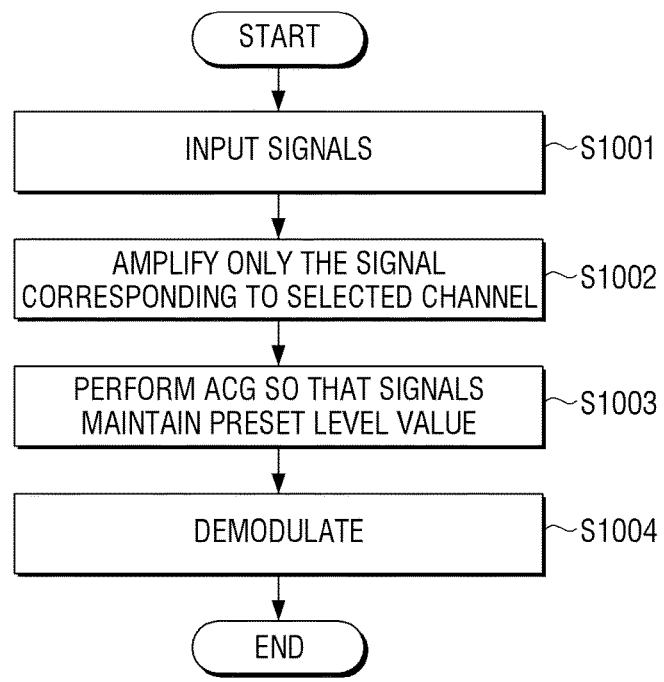
FIG. 10 is a flowchart illustrating an example control method of a broadcast receiving apparatus according to an example embodiment.

FIG. 10 is a flowchart illustrating an example control method of a broadcast receiving apparatus according to an example embodiment.

At S1001, the broadcast receiving apparatus may be receive input signals.

At S1002, the broadcast receiving apparatus may amplify only the signals corresponding to a selected channel. Specifically, the broadcast receiving apparatus may amplify the input signals and then extract a frequency domain corresponding to the selected channel. Meanwhile, the broadcast receiving apparatus may amplify filtered signals, after filtering a preset frequency band not corresponding to a broadcast signal from the inputted signals. In this example, the preset frequency band not corresponding to the broadcast signal may be a communication signal, e.g., a LTE signal.

At S1003, the broadcast receiving apparatus may perform AGC so that the signal maintains a preset level value. Specifically, the broadcast receiving apparatus may adjust the level of signal with different methods according to the frequency band of the signal corresponding to a selected channel, and thus can automatically control the gains. For example, when the signal corresponding to the selected channel is the signal included in the VHF range, the broadcast receiving apparatus may AGC the signals with a first sensitivity so that the signals maintain a preset level value. Meanwhile, when the signal corresponding to the selected channel is the signal included in the UHF range, the broadcast receiving apparatus may AGC the signals with a second sensitivity that is less sensitive than the first sensitivity. Specifically, when the signal corresponding to the selected channel is included in the UHF range, the broadcast receiving apparatus may perform AGC of the signal only when the signal exceeds the preset range of the preset level value. In this example, the broadcast receiving apparatus may AGC with the second sensitivity only the signal band that corresponds to the UHD channel included in the UHF. In this example, the broadcast receiving apparatus may be additionally provided with a separate signal processing unit to process the signals of the signal band corresponding to the UHD channel included in the UHF.

Meanwhile, although not illustrated, the broadcast receiving apparatus may extract the signals of the band corresponding to a selected channel using a filter. Specifically, filters for extracting frequency bands corresponding to a plurality of signal processing units may be allocated respectively to extract the signals of the bands corresponding to the selected channel. The extracted frequency band may be down-converted and output for the demodulation at the demodulator. It is possible that the process of amplification, AGC and filtering may be repeated several times in order to extract the frequency band corresponding to a selected channel more accurately and to achieve the level of signal as desired by the demodulator.

At S1004, the broadcast receiving apparatus may demodulate the processed signals. Specifically, the broadcast receiving apparatus may demodulate the signals, which are amplified, extracted and level-adjusted and then outputted, into digital transport stream signals.

As described above, it is possible to add a separate signal processing unit to process only the signals of the frequency band in the UHF range that corresponds to the UHD channel that is susceptible to the influence of the LTE signals, such that the LTE signal filtering is not performed for the frequency band that is almost not susceptible to influence of the LTE signals. Accordingly, possible influence on the broadcast signal due to filtering can be prevented.

Further, when the selected channel is UHF range signal, by removing the frequency domain that corresponds to LTE signals first to thus reduce the influence from the LTE signals, and by adjusting the level of the signal with a lower sensitivity, it is possible to reduce the fluctuation of the signals provided to the demodulator 130 and thus provide optimum stability and viewing condition for the selected channel.

The foregoing example embodiments and advantages are merely examples and are not to be construed as limiting the example embodiments. The present teaching can be readily applied to other types of apparatuses. Also, the description of the example embodiments of the present disclosure is intended to be illustrative, and not to limit the scope of the claims.

What is claimed is:

1. A broadcast receiving apparatus, comprising:
an input comprising input circuitry configured to receive input signals;
a signal processing unit comprising signal processing circuitry configured to amplify a signal of a selected channel from among the input signal, and to perform automatic gain control to control the amplified signal to maintain a predetermined level value and to output the amplified signal which maintains the predetermined level value;
a demodulator configured to demodulate the signals output from the signal processing unit; and
a controller configured to control an operation of the signal processing unit and the demodulator,
wherein the controller is configured to control the signal processing unit to perform the automatic gain control with a first sensitivity with respect to the amplified signal, in response to the selected channel being a signal in a first frequency band, and to control the signal processing unit to perform the automatic gain control with a second sensitivity less sensitive than the first sensitivity with respect to the amplified signal, in response to the selected channel being a signal included in a second frequency band, and
wherein the second frequency band is an ultra high frequency (UHF) band, and the first frequency band is a frequency band different from the ultra high frequency (UHF) band.

2. The broadcast receiving apparatus of claim 1, wherein, when the selected channel is a channel in a second frequency band, the controller is configured to control the signal processing unit to perform automatic gain control only when a level value of the amplified signal is outside a preset range.

3. The broadcast receiving apparatus of claim 1, wherein the controller is configured to perform automatic gain control with respect to a level value of the amplified signal at a speed corresponding to the first sensitivity, in response to the selected channel being a channel in the first frequency band, and to perform automatic gain control with respect to a level value of the amplified signal at a speed corresponding to the second sensitivity, in response to the selected channel being a channel in the second frequency band, and
wherein a speed corresponding to the second sensitivity is slower than a speed corresponding to the first sensitivity.

4. The broadcast receiving apparatus of claim 1, wherein the signal processing unit comprises:

a first signal processing unit comprising first signal processing circuitry configured to process a signal in a very high frequency-low(VHF-L) signal band;
a second signal processing unit comprising second signal processing circuitry configured to process a signal in a very high frequency-high(VHF-H) signal band; and
a third signal processing unit comprising third signal processing circuitry configured to process a signal in an ultra high frequency(UHF) signal band,
the controller is configured to control the first and second signal processing units to perform automatic gain control with the first sensitivity, and to control the third signal processing unit to perform automatic gain control with the second sensitivity.

5. The broadcast receiving apparatus of claim 1, wherein the signal processing unit comprises:
a first signal processing unit comprising first signal processing circuitry configured to process a signal in a very high frequency-low signal band;
a second signal processing unit comprising second signal processing circuitry configured to process a signal in a very high frequency-high signal band;
a third signal processing unit comprising third signal processing circuitry configured to process a signal in a band corresponding to a UHD channel in an ultra high frequency signal band;
a fourth signal processing unit comprising fourth signal processing circuitry configured to process a signal in a ultra high frequency signal band other than a band corresponding to a UHD channel,
wherein the controller is configured to control the first, second and fourth signal processing units to perform automatic gain control with the first sensitivity, and to control the third signal processor to perform automatic gain control with the second sensitivity.

6. The broadcast receiving apparatus of claim 5, wherein the third signal processing unit further comprises a first filter configured to filter a preset frequency band not corresponding to a broadcast signal in the input signals.

7. The broadcast receiving apparatus of claim 5, wherein each of the first to fourth signal processing units comprises:
a plurality of amplifiers configured to amplify a level of the input signals;
a plurality of automatic gain control units each connected to the plurality of amplifiers and configured to adjust the level of the amplified signals with a preset value and to output the result;
a second filter configured to output only a signal among the adjusted signals that is in a band corresponding to the selected channel; and
a mixer configured to be receive signals output from the second filter, to down-convert the signals and to output the result.

8. The broadcast receiving apparatus of claim 7, wherein, when the level of the input signals is changed, the plurality of automatic gain control units each connected to the plurality of amplifiers of the first, the second and the fourth signal processing units are configured to adjust the signals with the first sensitivity so that the changed level of the signals is maintained at the preset level value, and to output the result.

9. The broadcast receiving apparatus of claim 7, wherein, the plurality of automatic gain control units each connected to the plurality of amplifiers of the third signal processing unit are configured to adjust the signals with the second sensitivity so that the level of the signals is maintained at the preset level value only when a changed level of the signals is outside a preset range of the preset level value, when the level of the input signals is changed, and to output the result.

10. The broadcast receiving apparatus of claim 5, wherein the band corresponding to the UHD channel is 698 MHz to 806 MHz.

11. The broadcast receiving apparatus of claim 1, further comprising a communication unit comprising communication circuitry configured to transmit the demodulated signals to an external device.

12. The broadcast receiving apparatus of claim 1, further comprising a display configured to display an image corresponding to the demodulated signals.

13. A method of controlling a broadcast receiving apparatus, comprising:
    inputting signals;
    amplifying a signal of a selected channel among the input signals,
    performing automatic gain control on the amplified signal to maintain a predetermined level value,
    outputting the amplified signal which maintains the predetermined level value; and
    demodulating the signals output from the signal processing unit,
    performing automatic gain control with a first sensitivity with respect to the amplified signal in response to the selected channel being a signal in a first frequency band, and performing automatic gain control with a second sensitivity less sensitive than the first sensitivity with respect to the amplified signal in response to the selected channel being a signal included in a second frequency band,
    wherein the second frequency band is an ultra high frequency signal band, and the first frequency band is a frequency band different from a ultra high frequency signal band.

14. The method of claim 13, wherein the outputting comprises, performing automatic gain control only when a level value of the amplified signal is outside a preset range when the selected channel is a channel in a second frequency band.

15. The method of claim 13, wherein the outputting comprises performing automatic gain control with respect to a level value of the amplified signal at a speed corresponding to the first sensitivity, in response to the selected channel being a channel in the first frequency band, and performing automatic gain control with respect to a level value with respect to the amplified signal at a speed corresponding to the second sensitivity in response to the selected channel being a channel in the second frequency band,
    wherein a speed corresponding to the second sensitivity is slower than a speed corresponding to the first sensitivity.

16. The method of claim 13, further comprising filtering a preset frequency band not corresponding to a broadcast signal in the input signals,
    wherein the band corresponding to the selected channel is any one of bands corresponding to very high frequency-low (VHF-L) signal band, very high frequency-high (VHF-H) signal band, a band corresponding to a UHD channel of an ultra high frequency (UHF) signal band, and UHF signal bands other than the band corresponding to the UHD channel.

17. The method of claim 16, wherein the outputting comprises:
    amplifying a level of the input signals;
    adjusting the level of the amplified signals to a preset value;
    outputting only a signal among the adjusted signals that is in a band corresponding to the selected channel; and
    down-converting the output signal that is in the band corresponding to the selected channel and outputting the result.

18. The method of claim 17, wherein, when the band corresponding to the selected channel is the VHF-L band, the VHF-H band and the UHF signal band other than the band corresponding to the UHD channel, and when the level of the input signals is changed, the adjusting comprises adjusting the signals with a first sensitivity so that the changed level of the signals is maintained at the preset level value.

19. The method of claim 17, wherein, when the band corresponding to the selected channel is the band corresponding to the UHD channel, and when the level of the input signals is changed, the adjusting comprises adjusting the signals with the second sensitivity so that the level of the signals is maintained at the preset level value only when the changed level of the signals is outside a preset range of the preset level value.

20. The method of claim 13, further comprising transmitting the demodulated signals to an external device.

* * * * *